United States Patent [19]

Carpenter et al.

[11] Patent Number: 4,754,408

[45] Date of Patent: Jun. 28, 1988

[54] PROGRESSIVE INSERTION PLACEMENT OF ELEMENTS ON AN INTEGRATED CIRCUIT

[75] Inventors: Kurt D. Carpenter, Essex Junction, Vt.; Roger K. Jackson, Longmont, Colo.; Keith W. Lallier, Essex Junction, Vt.

[73] Assignee: International Business Machines Corporation, Armonk, N.Y.

[21] Appl. No.: 800,569

[22] Filed: Nov. 21, 1985

[51] Int. Cl.[4] .............................................. G06F 15/60
[52] U.S. Cl. ..................................... 364/491; 364/488
[58] Field of Search ............... 364/491, 300, 489, 520, 364/488, 492

[56] References Cited

U.S. PATENT DOCUMENTS

| | | | |
|---|---|---|---|
| 3,653,072 | 3/1972 | Ballas et al. | 364/491 |
| 3,654,615 | 4/1972 | Freitag | 364/491 |
| 3,702,004 | 10/1972 | Eskew et al. | 364/491 |
| 4,495,559 | 1/1985 | Gelatt et al. | 364/491 |
| 4,593,363 | 6/1986 | Burstein et al. | 364/300 |
| 4,615,011 | 9/1986 | Linsker | 364/491 |
| 4,630,219 | 12/1986 | DiGiacomo et al. | 364/491 |

OTHER PUBLICATIONS

IBM Technical Disclosure Bulletin, vol. 13, No. 1, Jun., 1970, pp. 274-276, T. C. Raymond.
IBM Technical Disclosure Bulletin, vol. 17, No. 10, Mar., 1974, pp. 3121-3125, W. E. Donath.
IBM Burlington Technical Bulletin, TR 19.90024, "A System for Automatic Layout of Gate Array Chips", Sep. 1981, Lallier, Hickson and Jackson.

*Primary Examiner*—Parshotam S. Lall
*Assistant Examiner*—David C. Goldman
*Attorney, Agent, or Firm*—Sughrue, Mion, Zinn, Macpeak & Seas

[57] ABSTRACT

A method of placing circuit elements in an integrated circuit. The chip area is divided into a grid. In an initial pass, the elements are randomly placed in the grid locations, and these placements are recorded. Thereafter, the elements are sequentially replaced in each of the grid locations, and a score is calculated for the wiring interconnections to the remaining elements as they were last recorded. The placement yielding the best score is recorded for that element. This placement is repeated for each of the elements. Once all the elements have been replaced, a final score is compared with the last best score. If the recent final score is better, the placements associated with that score are saved as the best placements. Then the process of replacement is repeated until a given number of iterations fails to yield a better score.

7 Claims, 3 Drawing Sheets

PROGRESSIVE INSERTION PLACEMENT OF ELEMENTS ON AN INTEGRATED CIRCUIT

BACKGROUND

This invention relates generally to the layout of integrated circuits. In particular, this invention relates to a method of ordering elements within an integrated circuit in order to minimize the length of connections between the elements of the integrated circuit.

In many types of integrated circuits there are a large number of well defined elements which need to be interconnected. Often the interconnections are such that there is not readily apparent sequence in which the elements should be arranged. At first glance, the elements can be randomly placed on the chip, and then the necessary interconnections can be made. This situation is in sharp contrast to semiconductor memories in which there is a natural order of the memory cells, the attached drive circuitry and the input/output circuitry. However, it is obvious that a random placement of the elements is likely to produce an unacceptably high complexity in the interconnections. Thus, it is desirable that the elements be place intelligently in order to simplify the interconnection problem. There are several possible scores that may be applied to evaluate a required set of interconnections. The one which will be addressed here is a score that approximates the distance of wiring extending from any element and sums these distances for all elements. A minimum score is, therefore, desired. Other scoring techniques are, of course, possible.

Once all the elements have been placed on the chip, the score of that particular placement can be evaluated. Of course, better scores may exist for different placement arrangements. Unfortunately, there are typically too many elements to allow the scoring for all possible arrangements. Hence, the problem exists of finding in a reasonable time near optimal or acceptable placement, as measured by the score.

One class of integrated circuits which require this type of placement are LSI and VLSI chips using structured arrays, that is, gate arrays. The layout requires fast and effective methods to automatically place large number of interrelated discrete elements. The individual elements must be placed on a two dimensional surface, and the elements have different lengths and widths. Accordingly, an associated problem is fitting these elements together so as to minimize the amount of chip area that is not being utilized.

Two methods commonly used for moving placement elements are "pair-wise interchange" and "insert and bump". These techniques have inherent deficiencies when applied to a very large two dimensional problem, especially when there are differently sized placement elements.

The "pair-wise interchange" method involves the process of finding two size-compatible elements or groups of elements that will yield an improvement in score when interchanging locations. The restriction of finding two compatibly sized objects limits the flexibility as to where an object can be placed. The additional restriction of finding two objects that will mutually improve the score also constrains the flexibility of movement. These restrictions often limit the number of possible moves, thus slowing down and inhibiting the heuristic process of evolution. The computational time required when using this method has been historically excessive when applied to large problems.

The other commonly used method, "insert and bump", provides flexibility to element movement because the elements are individually placed and inserted into new positions one at a time. This technique is generally used to solve a one dimensional placement problem where the elements need only "bump" in one direction to preserve legality. The scoring of each move includes the direct effect of inserting the element in a new position and the secondary effect of elements being offset by the move. When applying this technique to a two dimensional problem, all elements may bump both in the "x" and the "y" directions. The resolution of the overlap caused by inserting an element will involve the evaluation in both dimensions and perhaps cause a significant ripple effect. The lack of effective and fast techniques for this accommodation procedure makes this method unattractive for two dimensional placement.

Besides the above two general techniques, there are many other known methods for placing elements in a two dimensional array. Freitag in U.S. Pat. No. 3,654,615 discloses a method in which all the elements are ordered in a priority sequence according to the greatest relationship of connectivity to the remaining elements. Then the first element in the priority list is placed in a predetermined central position, and the second element is placed in an adjacent position. Thereafter, the remaining elements in the priority list are sequentially placed in positions which produce the best connnectivity score so that the placement progresses outwards.

Ballas et al in U.S. Pat. No. 3,654,072 and Eskew et al in U.S. Pat. No. 3,702,004 disclose a method in which devices associated with connectors are positioned next to the connectors. Thereafter, the devices are scored according to the percentage of connections to already placed devices. The device with the highest score is then placed in the position with the best wireability. The scores are recomputed, and the process is repeated to place all devices. Once all the devices have been initially placed, a pair-wise interchange is performed to improve the score even further. Somewhat similarly, Isett et al in U.S. Pat. No. 3,621,208 disclose a method for interconnecting devices in preassigned rows by considering the devices in a sequence according to their length of interconnections.

Raymond discloses a placement method in IBM Technical Disclosure Bulletin, Vol. 13, No. 1, June 1970 at pages 274–276. In this method, the elements are initially randomly placed. Thereafter, each device is tentatively placed in another socket. If the newly placed device is connected to a device already in that socket, then the devices are interchanged. Thereby, a wiring matrix is generated which denotes the wire length necessary for placement in every location which can be used in a linear assignment problem. The process can be iterated to obtain better scores although the scores may not be monotonically improving.

Donath in a technical article appearing in the IBM Technical Disclosure Bulletin, Vol. 17, No. 10, March 1974 at pages 3121–3125 discloses a placement method in which elements are clustered in a higher level of a hierarchy and are divided progressively in the lower levels. Initially, the elements are randomly assigned at each node of the hierarchical tree. Thereafter, interchange is used in a graph theory approach to improve the connectivity.

Lallier, Hickson and Jackson have presented a paper entitled "A System for Automatic Layout of Gate Array Chips" at the Electronic Design Automation Conference in England, Sept. 1–4, 1981 which has been distributed in TR 19.90024 by IBM in its Burlington Technical Bulletin. This method clusters associated elements in a higher hierarchical level. Elements can be initially randomly placed. Thereafter, scores can be improved by pair-wise interchange or by movement of single elements to calculate a provisional score before choosing the best placement.

Gelatt, Jr. et al in U.S. Pat. No. 4,495,559 disclose an iterative interchange method which is allowed to converge non-montonically.

SUMMARY OF THE INVENTION

Accordingly, it is an object of this invention to provide a method of placement which tends to provide the best score.

It is another object of the invention to perform the nearly optimal placement in a small number of steps.

It is a further object of this invention to provide a placement method which allows for the rearrangement of sub-elements within larger elements without unduly complicating the placement procedure.

The invention can be summarized as a placement method in which the elements are first randomly placed and this random placement is scored. A priority sequence is assigned to the elements. The elements are then inserted, in the sequence of the priority, into available space which provides the best score. This new arrangement, after all elements have been replaced, is then compared with the last best score. If the new score is better, the new arrangement is saved. Otherwise, additional rearrangements are attempted until a set number of rearrangements does not result in an improvement in the score.

DETAILED DESCRIPTION OF THE PREFERRED EMBODIMENTS

Figure 1:
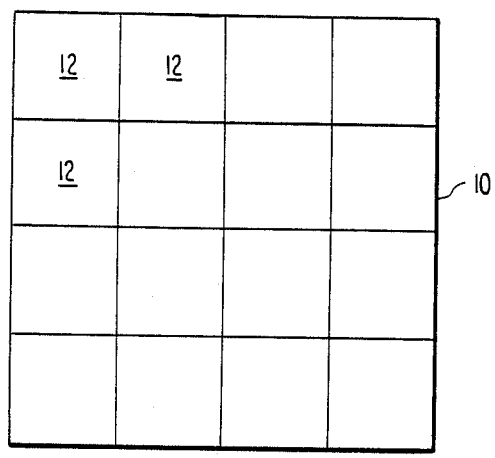
FIG. 1 illustrates a grid on a semiconductor chip.

In this invention, a chip area 10, as shown in FIG. 1, is divided into grid locations 12 of equal area arranged in checkerboard fashion. The array which is to have its constituent elements placed on the chip area 10 is typically modeled by placing the individual elements in a selected one of the grid locations 12. The placement of an element within a particular grid location 12 is legal if the grid location can accomodate the element.

Figure 2:
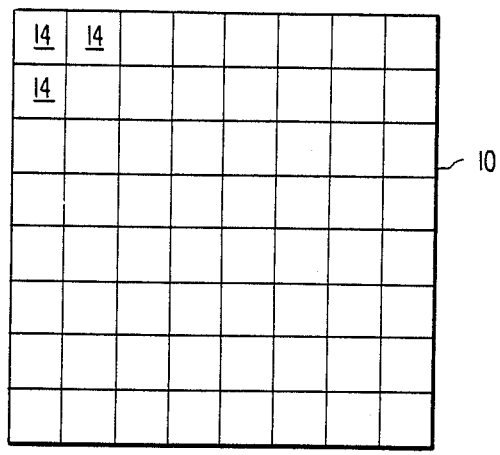
FIG. 2 illustrates another grid but with a finer grid size.

The invention contemplates a hierarchical grid system. At a first or highest level, the grid structure is relatively coarse, as shown in FIG. 1. The placement is performed at each level of the hierarchy. Therafter, the grid is subdivided, as shown in FIG. 2, in which second level grid locations 14 have one-quarter the size of the grid locations 12 of the previous level. The hierarchical grid approach is accompanied by a clustering technique which associates many sub-elements in a larger element. The larger element has a well defined size but an undefined shape. The clustered element can be placed in a large grid location 12 without regard to its shape. However, at some point in the hierarchy, perhaps at the second level of FIG. 2, both the sizes and shapes of the elements to be placed become important. However, the previous placement of all the sub-elements of the cluster within the larger grid location 12 provides a good starting point without an unduly long process. Finding first a solution for the higher levels of the hierarchy allows the placement to focus on and solve the global placement relationships without being constrained by the more detailed, localized placement relationships. This technique becomes especially effective when the number of grids and the number of placement elements become very large. The placement of unshaped elements at the higher levels allows placement techniques that are more approximate and forgiving, and therefore are faster to execute.

At each level of the hierarchical placement, an iterative placement process is performed. A scoring algorithm is required which gives a definite measure of the benefits of the placement arrangement. The elements are prioritized according to some measure of importance. The higher priority element is placed into the grid location which yields the best score with respect to the other elements, as located in previous steps. Then the process is sequentially repeated for each element in the priority list. Once all the elements have been replaced, a total score is computed and compared with the score obtained before this sequencing through the priority list had been performed. If the score is better, the new locations are stored as the best placement to date. Then the iterative process is repeated, beginning with the last arrangement, even if the last arrangement resulted in a worse score. The iterative placement process is repeated at a level of the hierarchy until further rearrangement produces no further improvement in the score after a set number of iterations, or until a predetermined number of iterations have been tried. Then the grid size is reduced, and the next level of the hierarchy is executed.

The scoring criteria used for moving an element should be both computationally fast and a meaningful model of wirability. Although there are many possible scoring algorithms, the one to be described here involves the length of wiring interconnections.

A net is an interconnection to which two or more elements must be connected. Associated with each net will be a wiring list for every element connected to that net. Whenever a score is required, for each net a rectangle is computed which includes all elements to which that net is connected. The half-perimeter of that rectangle is a measure of the extent of that net. The sum of the half-perimeters of all the nets will be the total score. Of course, the lower the score, the better the score since shorter interconnects are then required.

Figures 3, 4:
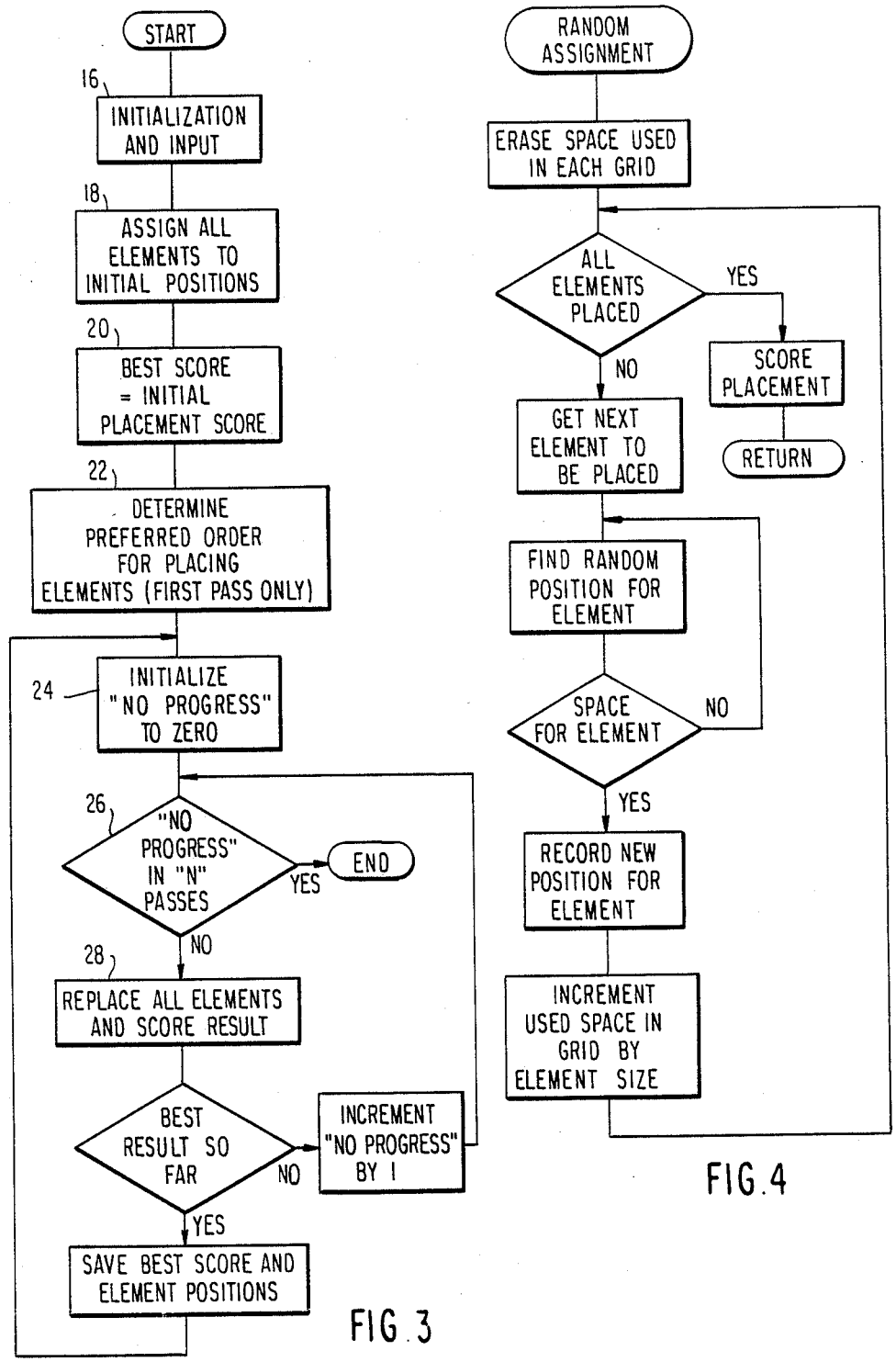
FIG. 3 is a flow chart illustrating one method of practicing the invention.
FIGS. 4–6 are flow charts detailing parts of the flow chart of FIG. 3.

The flowchart for the operation at a single level of the hierarchy of the invention is shown in FIG. 3. In the first step 16, data is input, and the program is initialized. For the higher levels of the hierarchy, the data consists of the elements, their size, and the interconnections to the set of nets. Then, in the second step 18, the grid assignment of the elements is performed. At the highest level of the hierarchy, this assignment is a random assignment. At lower levels, the assignment involves a grid transposition based upon the previous level of the hierarchy. Associated with each grid location is an occupancy memory which records how much of that location is filled with placed elements. An element can be legally placed in a location only if the occupancy memory shows that there is space remaining sufficient to accommodate the size of that new element. Once an element is placed in the location, the occupancy memory of that location is adjusted to reflect the placement. In this type of placement, the shape of the element is immaterial. It is only in the lower levels of the hierarchy that the shape becomes important, as will be described later.

In the initial placement, the elements are randomly placed in the grid locations 12. The inventors have found that, if the initial placement is performed according to some preconceived concept of how the elements should be arranged, then the presented algorithm is unlikely to produce its best arrangement. That is, the initial score is relatively good, and the algorithm will give only modest improvement upon it. However, they have found that, if the initial placement is random, the initial score is bad, but then the algorithm can improve the score significantly, resulting in a better final arrangement.

The details of the initial random placement procedure are shown in FIG. 4. The space used in each of the grid locations 12 is erased so that no elements are assigned to any of the grid locations and the occupancy of all grid locations is zero. Then, a loop is entered for sequentially processing all the elements. If there are elements remaining to be processed, then the next element in an arbitrary sequence is obtained. A random grid location is chosen and is tested for its percentage occupancy to determine if there is space remaining for the area of the element being processed. If there is insufficient space in that grid location, the process is repeated until a grid location is found which does provide the necessary space. Once the space has been found, the element is recorded as occupying that grid location, and the occupancy of that grid location is incremented to reflect the size of the element now occupying that location.

The loop is repeated until all the elements have been placed. It should be obvious that, if the element sizes are not equal, a situation could arise where there are not grid locations separately having sufficient space to accomodate the final elements. This problem is handled by means of population control. A grid is allowed to borrow space from its neighbors. If even this is insufficient, the element is paced in "some" location, borrowing space from other grids. Thus the space allocation model allows approximation to avoid the discrete area fracture problem.

Figure 5:
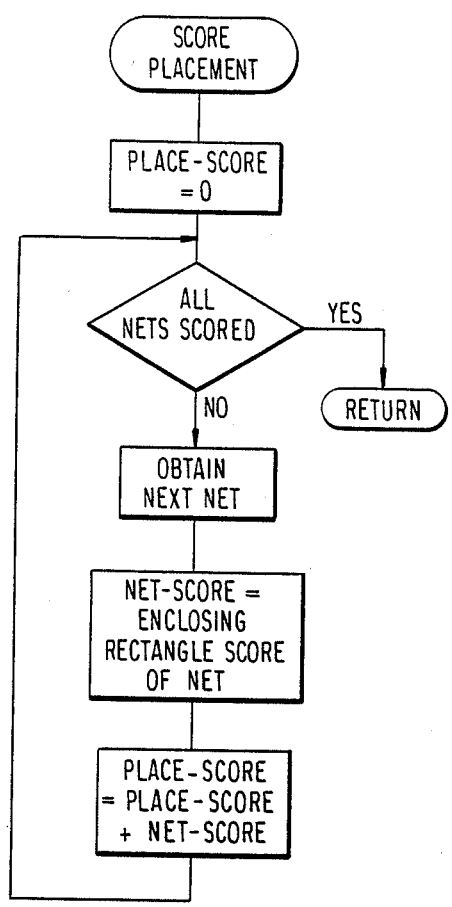

Once all the elements have been placed, the placement is scored in step 20 of FIG. 3. The scoring algorithm is given in FIG. 5. The placement score is first initialized to zero. Then a loop is entered for sequentially processing all the nets for the integrated circuit. One of the nets is obtained, and the net score for that net is calculated. Associated with each net is a list of the elements connected to that net. The elements are now associated with grid locations in which they have been placed. The grid locations associated with the net are thus determined. A rectangle is computed which encompasses all the grid locations associated with the net being processed. The rectangle can be easily determined by finding the minimum and maximum positions in two dimensions for the associated grid locations. The rectangle will have a resolution of the size of the grid then being processed. That is, for example, wiring lengths will be the same for devices immediately separated by a grid boundary as for devices at the far corners of the grid locations. The placement score is incremented by the net score, and the loop is repeated for all the nets of the integrated circuit. The placement score is the total of all net scores.

The mobility of a placement element is dependent on the relative position of the element in the placement order. Elements placed early in the pass are free to move to almost any location since space is initially available in all of the grid locations. This mobility gradually decreases as objects are placed and the number of grids with available space for element placement decreases. This order dependency favors elements placed early in the placement pass.

As shown by step 22 in FIG. 3, the elements are placed in a preferred order for placement. This priority list is arranged in descending order of importance. Some type of score is calculated for each of the elements relative to the rest of the elements to be placed. The criteria for importance may vary and are usually based on a combination of element size, electrical performance and the connectivity to other elements. The value of the score determines the ranking in the priority list. It is not essential that a priority list for preferred order be used in the method of this invention, but it has been found that better scores are achieved and that the placement converged on a solution faster when this type of ordering scheme is used.

Figure 6:
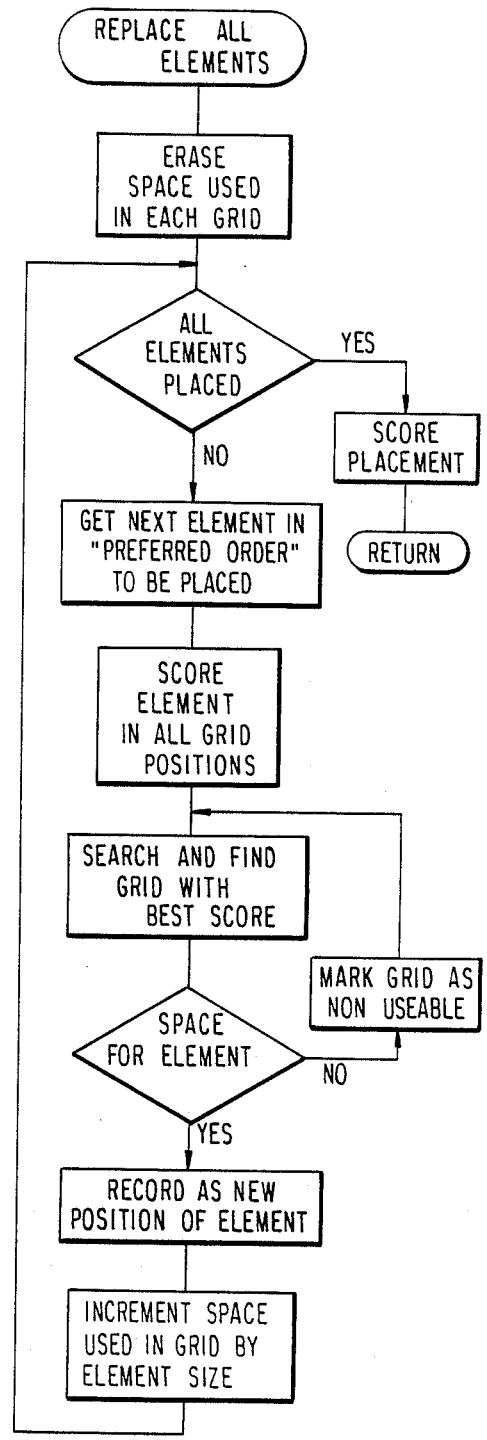

Once the initial steps described above have been performed, a series of loops are entered. At the start of the outer loop, in step 24 a variable NO PROGRESS is initialized to zero which indicates the number of iterations that have been attempted at improving the score with a new placement arrangement but without resulting in an improvement in the score over the best previous score. At the start of an inner loop in step 26, NO PROGRESS is compared with a predetermined variable N to decide if no progress has been accomplished in the preceding N iterations of the inner loop. If there has been no progress in the preceding N iterations, then the placement is completed at this level of the hierarchy. If the test of step 26 is not passed so that another attempt will be made to improve the score, then in step 28 all the elements are replaced and the result is scored. This important step 28 is shown in detail in FIG. 6.

The occupancy memory associated with each grid location is first initialized to zero so that all the space is initially available. Then a loop is entered for sequentially processing the elements according to the preferred order in the priority list. If there are elements remaining to be processed, the next element of descending importance is obtained. That element is then placed in each of the grid locations and a score is calculated for each of these placements, according to an algorithm similar to that of FIG. 5. For purposes of scoring, the locations of the elements other than the one being currently placed are the locations most recently recorded. That is, the locations are not necessarily those of the arrangement which resulted in the best score to date. A recorded location for an element can be either that recorder in this replacement step or the recorded location from the previous step. That is, recorded locations are being continuously updated. Once the scores for all grid locations for the element being placed have been calculated, the grid location which results in the best score is chosen for that element. However, a test is made of the occupancy memory associated with that location to determine if there is space available therein to place an element of the size of the current element. If the space is not available, then the grid location is marked as unusable, and the grid locations are again searched for the placement resulting in the best score.

Once a legal grid location has been found, the element is recorded as being positioned at that location, and the occupancy memory associated with that grid location is incremented by the size of the element being placed. These recorded positions are used for subsequent scorings even if there is an intermediate determination that the placement arrangement does not produce the best score. Then the next element in the priority list is replaced in another iteration of the loop. Finally, when all the elements have been replaced, the final arrangement is scored.

Referring again to FIG. 3, the score of the final arrangement is compared with the previous best score. If the current score is better than the previous best score, then the best score is replaced by the current score and the positions of the elements on the grid that produced the current score are saved as the best positions. That is, the recorded positions become the new best position. Execution then returns to the beginning of the outer loop to see if the best score can be improved even further.

However, if the current score is no better than the previous best score, then the NO PROGRESS variable is incremented by one and execution returns to the beginning of the inner loop. On subsequent executions of the inner loop, the recorder positions of the elements are those positions resulting from the previous execution of the inner loop, but the best score and best locations remain those existing before the inner loop was entered. At some point, N consecutive iterations of the inner loop will not result in an improvement in the score so that the NO PROGRESS test will cause execution to pass out of the loops of FIG. 3. Multiple attempts at improving the score are allowed because it has been observed that a partial rearrangement may degrade the score but that further rearrangments may yield a score better than the last best score. That is, the scoring manifests local maxima and minima in the rearranging sequence. At some point, however, the rearranging is discontinued and the last best arrangement is taken to be the final arrangement for this level of the hierarchy.

By the use of the above process, there results the gradual building of a new placement solution in which element movement is based on the latest recorded positions of the elements and on the availability of grid locations with enough space to contain the element. Initially, all of the grid locations will be empty so that element movement will be based entirely upon past history. The population model and placement solution then become progressively more realistic and meaningful as the elements are placed and occupy the available space in the grid locations. The assignments become completely current when all of the elements are placed.

This process also minimizes legality constraints and thus increases the mobility of element movement and makes the computation for scoring and evaluating a move very simple and fast. Using "progressive insertion", each element need only search and find the best location with enough available space for the element being placed. The algorithm does not have to spend time or be limited to finding compatible countermoves as in "pair-wise interchange" or have to find some type of "bumping" pattern to accommodate the overlapping space of an inserted object as in the "insert and bump" technique. The "progressive insertion" technique provides the elements with additional flexibility so that moves can be based more on wirability and less on the fit of the elements, particularly during the early parts of a placement pass when "global" evolution occurs.

The progressive insertion process creates a situation where the placement elements continually migrate locally among positions from pass to pass. This constant movement occurs when an element is placed in a location different from the last pass and absorbs the available space in the new grid. The element previously located in the new grid may be then forced to be displaced to a different location when it is placed somewhat later. This indirect bumping propagates throughout the rest of the placement pass as the rest of the elements are placed. The result is a constantly changing environment.

This constant movement has both good and bad effects. It is beneficial in that the continual migration prevents the process of placement from getting prematurely stuck. The detrimental effect occurs during the final stages of placement when local optimization is desired. The constant bumping inhibits the development of a stabilized detailed environment from which element moves can be scored for localized improvements. Such improvements in the placement result can usually be found if the progressive insertion, described above, is followed by some other more constrained technique, such as pair-wise interchange, which maintains a legal population model for each placement move. These other methods are computationally more costly so a trade-off must be made betweeen the improvement in quality and the computation resources required.

Another approach is to perform the progressive insertion in an hierarchical system. The above described progressive insertion can be repeated a number of times with progressively smaller grid sizes. Of course, the placement of elements is not randomized at the beginning of lower level of hierarchy except to place the elements within one of the smaller grid locations occupying the larger grid location that previously accommodated the elements.

A significant improvement can be obtained if the elements are clustered together for a higher hierarchical level but are broken apart into the constituent elements at a lower level of hierarchy. The clusters would consist of elements which have a high degree of connectivity between them but have a relatively low degree of connectivity to other elements. Clusters of elements are particularly appropriate for the progressive insertion described above since a cluster has a well defined size but its shape is somewhat arbitrary. Accordingly, at a high level of the hierarchy, several clusters can be positioned in a large grid location with no consideration given to how those clusters will fit together in the grid location. It is necessary only that there be space available for that sized cluster.

At some point in the hierarchy, the shape of the elements becomes important. This happens when the grid size approaches the size of the detailed physical elements being placed. A flip-flop would be an example. When the grid size is approaching these sizes, both the shape and size of the elements need to be considered. For instance, an element 16, shown in FIG. 7, has an area of only one grid location, but it must occupy at least two vertically adjacent grid locations 14 due to its shape.

Figure 7:
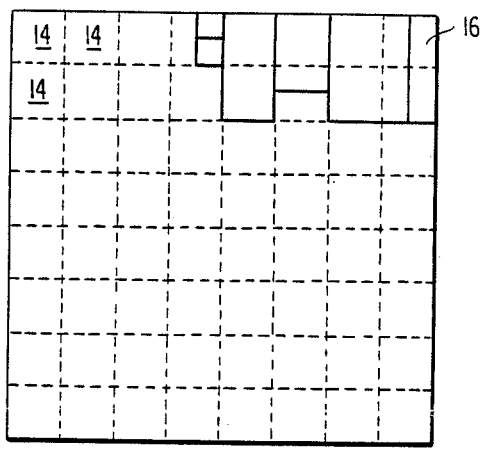
FIG. 7 illustrates the precipitation of shaped elements on a grid.

Accordingly, when shapes of the elements become important, the progressive insertion needs to be modified. It has been found that elements can continually be placed on the basis of area alone as long as the elements do not overlap more than two cells. That is, the maximum dimension of an element is no more than twice the grid size. Of course in this situation, an element can be placed only where two neighboring cells have the requisite space. When the grid size is reduced even further, any elements having too large a size are precipitated at legal positions occupying neighboring grid elements. The precipitation is final and the elements no longer move. As illustrated in FIG. 7, the precipitation can divide the then current grid size. Attempts should be made to position any precipitated element within the legal grid locations in positions immediately adjacent already precipitated elements so as to minimize available space fragmentation for the unplaced elements.

At the final level of the hierarchy, all elements are precipitated, whether or not the size limit has been exceeded. The process continues until all elements are precipitated.

The "progressive insertion" described above is a new method for rapidly converging, high quality placement solutions. It allows the use of relaxed legality constraints, thereby making the method very useful for global evolution. The applicability to a problem with various sized objects makes the method attractive when macro cells may be present and when an approximate placement of element clusters is desired. The computationally fast and mobile element movement makes this method a very effective placement tool for the VLSI placement problem. Of course, it is to be appreciated that the method can be used for other types of placement than integrated circuit design.

What is claimed is:

1. A method of determining the placement of a plurality of interrelated elements to be placed in fixed physical location and thereafter interconnected to form a functional integrated system, said method comprising the steps of:
   a. randomly determining for each of a plurality of elements a respective different one of plural physical locations to establish a preliminarily determined location for each element, said randomly determining being an intermediate placement determining;
   b. recording said randomly determined locations;
   c. scoring a placement interconnection score for all of the elements according to said randomly determined locations, said score being a first score;
   d. establishing a predetermined order of placement for each element;
   sequentially placing, according to said predetermined order, an element in all available locations, scoring said placement with respect to all other elements based on the last recorded locations of said all other elements, and recording the placement of said placed element in the location obtaining the best score;
   f. repeating step "e" for all said elements;
   g. if the final score of steps "e" and "f" is better than said first score, in an intermediate placement determining, determining the placement of all said circuit elements according to the last occurring recorded placement of steps "e" and "f" and setting said first score to said final score, otherwise maintaining the current intermediate determined placement; and
   h. repeating steps "e", "f" and "h" until the final score in step "g" is no better than said first score for a predetermined number of sequential repetitions, the intermediate determined placements at the end of this step being the finally determined placements.

2. A method according to claim 1, wherein said elements are to be interconnected to form a functional integrated system which is a two-dimensional integrated circuit, said elements are circuit elements and said interconnection score is a wiring score.

3. A method according to claim 2, wherein said scoring comprises calculating the sum of the maximum lengths of all interconnecting wirings.

4. A method according to claim 1, further comprising the step of dividing an area for placement into grid locations and wherein said placing step comprises placing said elements into said grid locations.

5. A method according to claim 4, further comprising memorizing an occupancy of each said grid location by said elements, and wherein an available grid location for a given element is a first grid location for which the sum of the memorized occupancy for said first grid location and an occupancy required for said given element does not exceed a maximum occupancy for said first grid location.

6. A method according to claim 4, wherein steps "a" through "h" are executed for grid locations of a first grid size and steps "e" through "h" are repeated for grid locations of a second grid size smaller than said first grid size.

7. A method according to claim 6, further comprising the step of reserving portions of said grid locations for elements having a maximum dimension larger than a predetermined relationship to the current grid size, any element having said reserved portions thereafter not being placed in step "e".

* * * * *